(12) United States Patent
Sinha (10) Patent No.: US 6,511,906 B1
(45) Date of Patent: Jan. 28, 2003

(54) SELECTIVE CMP SCHEME

(75) Inventor: Nishant Sinha, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/943,381

(22) Filed: Aug. 30, 2001

(51) Int. Cl.[7] .................. H01L 21/4763; H01L 21/302
(52) U.S. Cl. ................. 438/633; 438/637; 438/650; 438/692
(58) Field of Search .................. 438/633, 690–693, 438/622–624, 650, 637–641

(56) References Cited

U.S. PATENT DOCUMENTS

| | | | |
|---|---|---|---|
| 5,439,551 A | | 8/1995 | Meikle et al. |
| 5,770,095 A | * | 6/1998 | Sasaki et al. |
| 5,795,495 A | | 8/1998 | Meikle |
| 5,863,307 A | | 1/1999 | Zhou et al. |
| 5,916,819 A | | 6/1999 | Skrovan et al. |
| 6,046,110 A | * | 4/2000 | Hirabayashi et al. |
| 6,063,306 A | * | 5/2000 | Kaufman et al. |
| 6,100,194 A | * | 8/2000 | Chan et al. |
| 6,117,783 A | * | 9/2000 | Small et al. |
| 6,136,218 A | | 10/2000 | Skrovan et al. |
| 6,153,490 A | | 11/2000 | Xing et al. |
| 6,171,436 B1 | | 1/2001 | Huynh et al. |

OTHER PUBLICATIONS

US 5,783,438, 7/1998, Gardner (withdrawn)
Masterton et al. "Chemical Principles"CBS College Publishing, 1983, pp. 165–167.*
Klebosol Slurry Products Most Widely Used Colloidal Silica Products for CMP, Klebosol Rev 1. 3/00.

* cited by examiner

Primary Examiner—Ha Tran Nguyen
(74) Attorney, Agent, or Firm—Killworth, Gottman, Hagan & Schaeff LLP (57) ABSTRACT

A semiconductor substrate with a plurality of semiconductor devices formed therein is processed by initially forming a silicon nitride insulating layer over the semiconductor devices. Interconnect holes are formed in the insulating layer. The interconnect holes are filled with a silver-based conductive material so that portions of the silver-based conductive material extend beyond the uppermost boundary of the interconnect holes. The device is then chemically and mechanically planarized with a processing slurry selected to be minimally selective of silicon nitride and relatively highly selective of the silver-based conductive material. The processing slurry comprises an abrasive and an oxidizer. In this manner, the portions of the silver-based conductive material extending beyond said uppermost boundary of the interconnect holes are removed.

19 Claims, 5 Drawing Sheets

SELECTIVE CMP SCHEME

BACKGROUND OF THE INVENTION

The present invention relates generally to the formation of integrated circuit interconnect structures, and more specifically to a technique for forming silver metal interconnects within integrated circuit devices. The present invention also relates, more generally, to the formation of a variety of semiconductor device structure such as, for example, transistors, capacitors, and interconnects.

Silver is considered an important material for manufacturing a variety of types of PCRAMS, such as dynamic random access memories (DRAMs), static random access memories (SRAMs), etc., and other integrated circuit devices. Unfortunately, there are a number of manufacturing obstacles attributable to the use of silver in integrated circuit device fabrication. Specifically, silver and silver-based materials adhere poorly to many materials utilized in integrated circuit devices. For example, a silver conductive plug adheres poorly to tungsten and it is not uncommon for a chemical mechanical planarization (CMP) process employed in integrated circuit device fabrication to result in inadvertent removal of a silver plug adhered to or contacting a tungsten layer. Accordingly, there is a continuing need for an improved silver CMP process in integrated circuit device fabrication.

BRIEF SUMMARY OF THE INVENTION

This need is met by the present invention wherein a scheme for silver CMP in integrated circuit device fabrication is presented. According to one embodiment of the present invention, an integrated circuit device processing scheme is provided where an integrated circuit device is chemically and mechanically planarized with a processing slurry selected to be relatively minimally selective of silicon nitride and relatively highly selective of silver-based conductive material. According to another embodiment of the present invention, the processing slurry comprises an abrasive and an oxidizer. Methods for fabricating an integrated circuit device and processing schemes for semiconductor wafers are also provided.

BRIEF DESCRIPTION OF THE SEVERAL VIEWS OF THE DRAWINGS

The following detailed description of the preferred embodiments of the present invention can be best understood when read in conjunction with the following drawings, where like structure is indicated with like reference numerals and in which.

DETAILED DESCRIPTION

The process steps and structures described below do not form a complete process flow for manufacturing integrated circuits. The present invention, which is primarily directed to the selection of specific CMP slurry compositions and specific integrated circuit materials for integrated circuit device fabrication, can be practiced in conjunction with a variety of integrated circuit fabrication techniques currently used in the art, and only so much of the commonly practiced process steps are included as are necessary for an understanding of the present invention.

The figures representing cross-sections of portions of an integrated circuit during fabrication are not drawn to scale, but instead are drawn so as to illustrate the important features of the invention. Moreover, although the exemplary embodiments described herein illustrates the present invention as applied to the formation and chemical mechanical planarization of interconnects at two specific levels of integrated circuit fabrication, the processing techniques of the present invention may also be applied to formation of interconnects at various levels of metallization within an integrated circuit fabrication process.

Figure 1A:
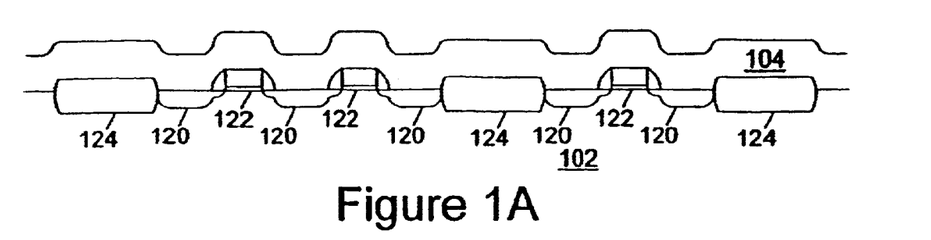
FIGS. 1A–1H depict cross-sectional illustrations of a process of forming silver interconnects according to one embodiment of the present invention.
Figure 1B:
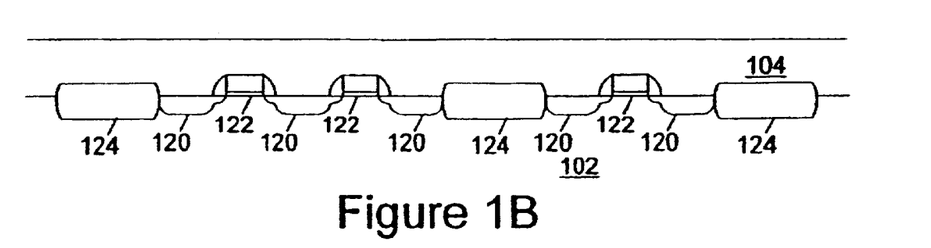

FIGS. 1A through 1H depict cross-sections for a process of forming silver interconnects in accordance with one embodiment of the present invention. The process begins with a plurality of devices having source/drain regions 120 and gates 122 and separated by isolation oxides 124, formed in substrate 102, as illustrated in FIG. 1A. A silicon nitride insulating layer 104 is formed over the devices and isolation regions, typically through a laser plasma chemical vapor deposition process (LPCVD). The silicon nitride insulating layer 104 typically has a thickness of between about 500 Å and about 1500 Å and may include an uppermost layer of silicon nitride and sub layers of different nitrides, oxides, fluorides and carbides. For the purposes of defining and describing the present invention, it is noted that formation of a layer or region "over a substrate" refers to formation above or in contact with a surface of the substrate. For example, where it is noted or recited that an insulating layer is formed over a plurality of semiconductor devices or over a substrate, it is contemplated that intervening structural layers may be present between the insulating layer and the semiconductor devices or substrate.

Figure 1C:
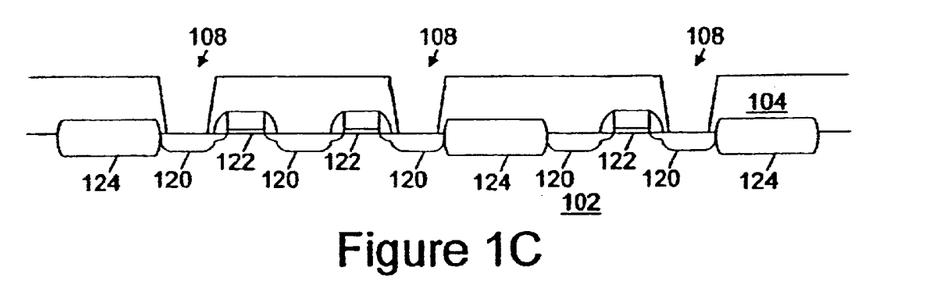
Figure 1D:
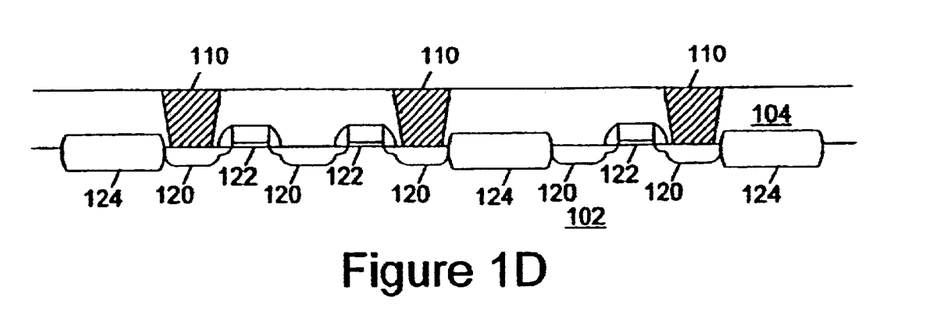

The silicon nitride insulating layer 104 is selectively etched to form contact holes 108, illustrated in FIG. 1C, exposing contact regions for devices within substrate 102. Contact holes 108 are then filled with conductive material, for example, tungsten, to form conductive plugs 110 as depicted in FIG. 1D, which will electrically connect the contact regions of devices within substrate 102 to subsequently formed interconnects. The processes for completing the steps illustrated in FIGS. 1A through 1D are well-known to those skilled in the art. Although the conductive plugs 110 may be formed with materials other than tungsten, e.g., nickel, platinum, nickel vanadium, tungsten nitride, the utility of the present invention is particularly clear in the context of tungsten plugs because many conventional processing schemes employing tungsten plugs suffer from and do not account for the poor adherence of silver interconnects to tungsten plugs.

Interconnects connecting conductive plugs 110 to other devices or input/output pads may subsequently be formed by a groove-filling process. One such groove-filling process is depicted in FIGS. 1E through 1H. The substrate surface, including transistors and other devices formed on the wafer, are covered with the insulating layer. A patterned photoresist is then formed using high-resolution photolithography, the resist including holes where contacts or vias are to be formed and elongated openings defining interconnect lines. The insulating layer is then etched, masked by the resist, to form grooves. These grooves are filled with metal by depositing a metal layer, and the metal layer is etched back to leave a conductive wiring pattern within the dielectric grooves separated by dielectric in the interwiring spaces.

Figure 1E:
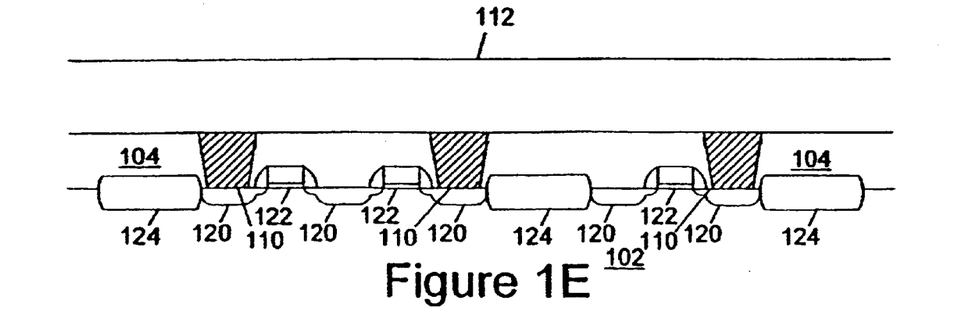
Figure 1F:
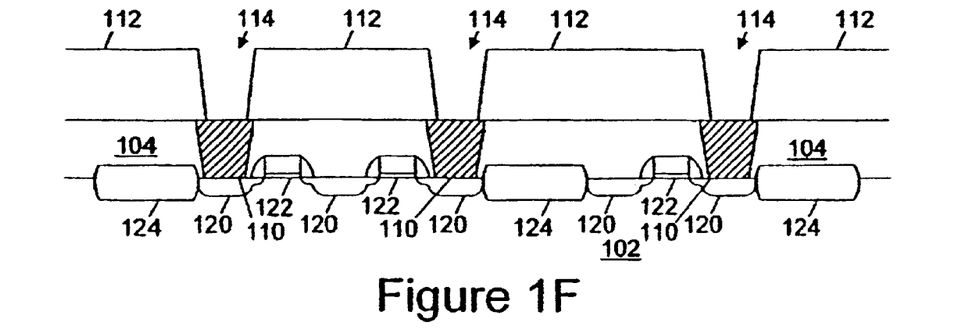

More specifically, a silicon nitride insulating layer 112 is formed over substrate 102, on insulating layer 104 and conductive plugs 110, as illustrated in FIG. 1E. The insulating layer 112 is then patterned and selectively etched to form grooves 114, as depicted in FIG. 1F. Grooves 114, shown in their smallest cross-section in FIG. 1F, expose a portion of conductive plugs 110 and extend over the insulating layer 104 from one conductive plug to another conductive plug contacting a different device or an input/output pad, defining the paths of the interconnects which will be formed within grooves 114. The groove 114 typically has a width at its narrowest point of between about 0.25 μm and about 10 μm and a height-to-width aspect ratio of between about 0.001 and about 2.

Figure 1G:
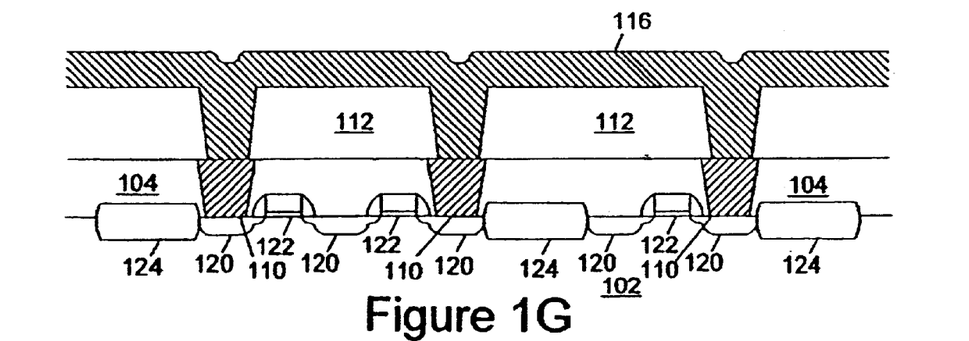
Figure 1H:
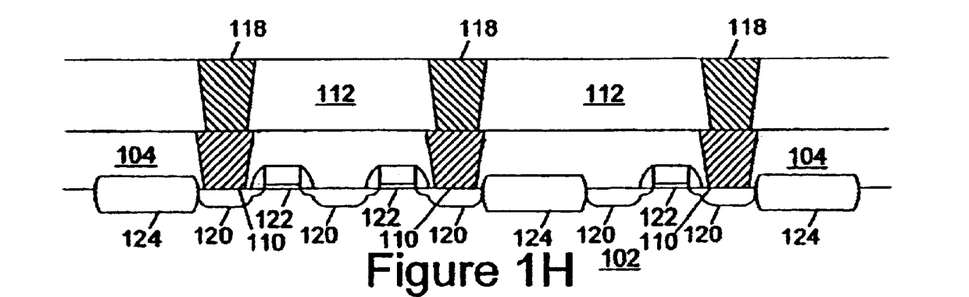

A layer of silver 116 is then formed over insulating layer 112 and within grooves 114, as illustrated in FIG. 1G, filling grooves 114. Portions of silver layer 116 above insulating layer 112 are then removed by selective chemical-mechanical polishing (CMP), as depicted in FIG. 1H. The CMP step leaves silver interconnects 118 within grooves 114 between adjacent portions of insulating material 112. The resultant interconnects, formed by CMP removal of upper portions of silver layer 116 above insulating layer 112, will have a substantially planar upper surface. The CMP scheme of the present invention is described in further detail herein with reference to FIG. 3 and is particularly advantageous because it is less prone to unintentional removal of the entire interconnect 118.

For the purposes of defining and describing the present invention it is noted that an interconnect comprises any type of conductive line connecting devices to each other within an integrated circuit structure, device, or assembly. Interconnects are also commonly referred to as plugs, contacts, vias, etc.

Figure 2A:
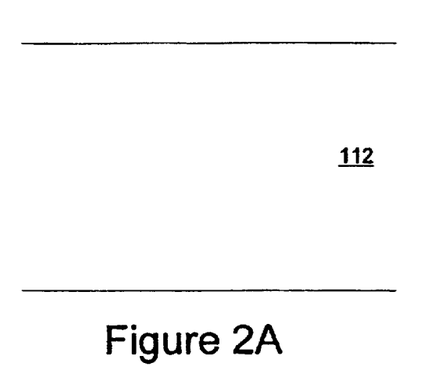
FIGS. 2A–2F are cross-sections for a process for forming silver interconnects according to another embodiment of the present invention.

Referring now to FIGS. 2A through 2F, cross-sections illustrating a process for forming interconnects in accordance with another embodiment of the present invention are shown. In the process depicted, a silver layer is formed over a grooved silicon nitride insulating layer and within the grooves, as illustrated above in FIG. 1G. The process begins, as depicted in FIG. 2A, by formation of silicon nitride insulating layer 112 over a substrate as previously described.

Figure 2B:
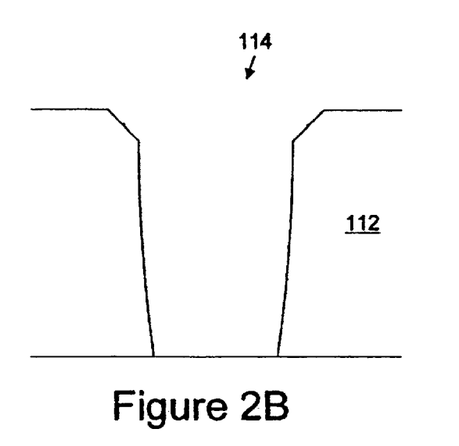

The silicon nitride insulating layer 112 is patterned and etched to form groove 114. The groove 114 typically has a width at its narrowest point of between about 0.25 μm and about 10 μand a height-to-width aspect ratio of between about 0.001 and about 2. Groove 114 defines the path of the silver interconnect which will be subsequently formed. Accordingly, groove 114 may be etched to run for a substantial distance across, or for the entire length of, a die containing the integrated circuit for which interconnects are desired, and may include changes in lateral direction as necessary. One or more sections of groove 114 may expose a contact region within the substrate below insulating layer 112. Suitable processes for forming grooves having the indicated features and dimensions are known in the art and may include, for example, an anisotropic etch followed by an isotropic etch.

Figure 2C:
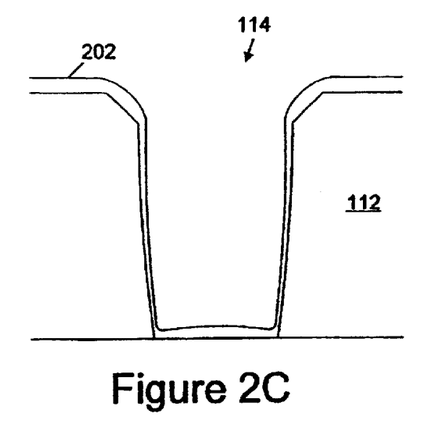
Figure 2D:
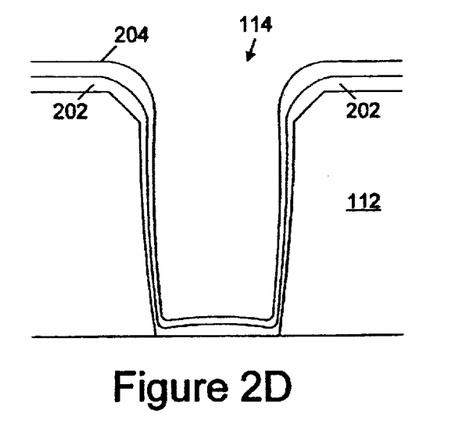

Following formation of groove 114 defining the interconnect path, an optional adhesion layer 202 may be formed over insulating layer 112 and on the sidewalls and bottom of groove 114, as depicted in FIG. 2C. Adhesion layer 202 may comprise any suitable material selected to promote adhesion between insulating layer 112 and subsequently formed layers. Adhesion layer 202 is preferably formed to a thickness of at least approximately 200 to 300 Å, although thinner or thicker adhesion layers may be suitable.

Following formation of adhesion layer 202, if formed, an optional barrier layer 204 may be formed over adhesion layer 202 above insulating layer 112 and on the surfaces within groove 114, including the sidewalls as well as the bottom. Barrier layer 204 prevents subsequently formed metallic materials from contaminating insulating layer 112. Barrier layer 204 is formed to a thickness of at least approximately 200 to 300 Å, although thinner or thicker adhesion layers may be suitable. It is noted that a barrier layer and an adhesion layer may also be employed in the interconnect structure described above with respect to FIGS. 1A–1H. It is also noted that the barrier layer 204 is more likely to be suitable for use in the context of an interconnect structure than it is for other types of integrated circuit components.

Figure 2E:
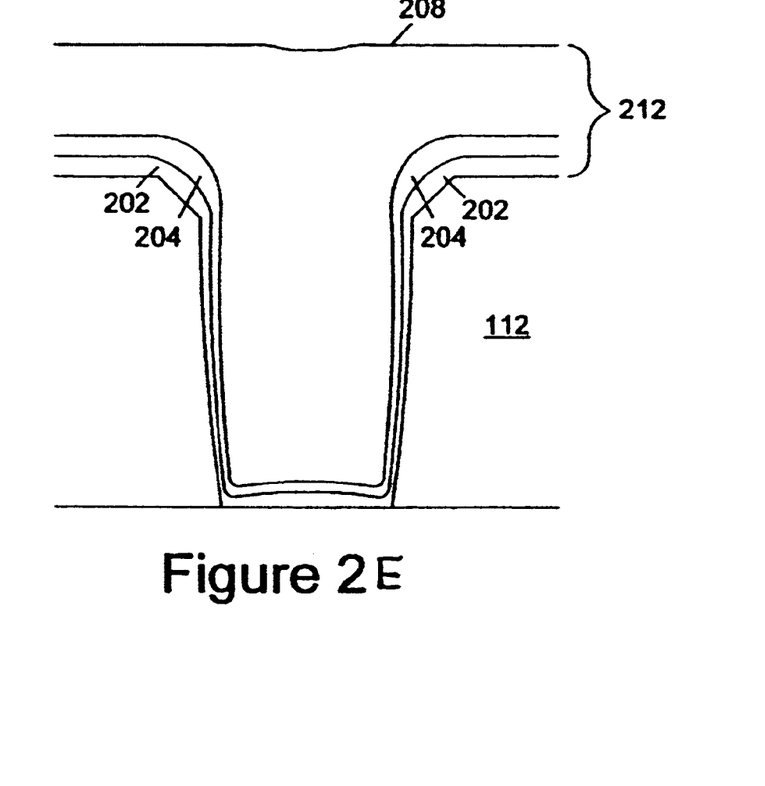

After formation of barrier layer 204 over the silicon nitride insulating layer 112 and within groove 114, a silver layer 208 is formed over insulating layer 112 and within groove 114 by conventional means, as depicted in FIG. 2E. Silver interconnects are advantageous because they have a lower resistivity than conventional metallic interconnects, and therefore may have reduced dimensions without effecting the voltages required for driving signals on the interconnect. Interconnects formed of aluminum, for example, require larger cross-sections than silver interconnects because of their higher resistivity. Silver also has advantages over the use of copper in forming interconnects. Specifically, silver is more thermally stable than copper, thus making silver more resistant to oxidation. Silver also has a much slower diffusion rate than copper, thus creating a more reliable contact to a silicon substrate or polysilicon landing pad. Additionally, electromigration is believed to be less of a problem with silver than with copper.

Figure 2F:
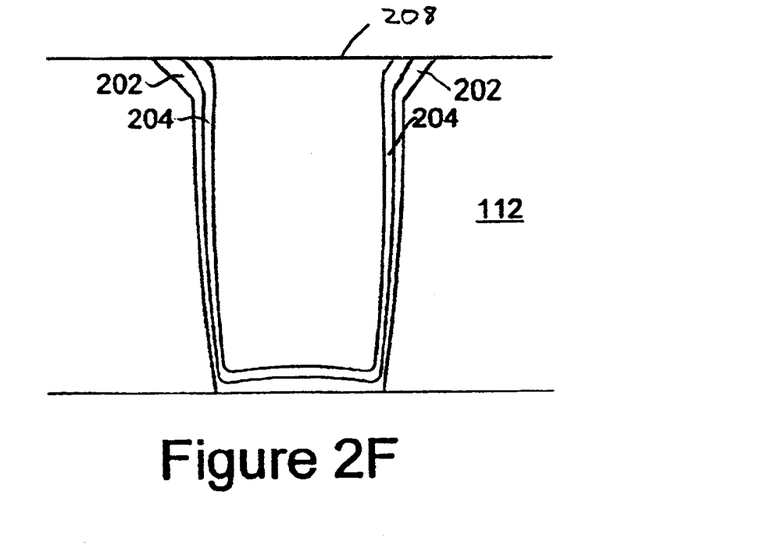

Finally, referring to FIG. 2F, the interconnect will be formed by removal of the portions 212 of silver layer 208, barrier layer 204, and adhesion layer 202 above the upper surface of insulating layer 112 through CMP, leaving the portion of silver layer 208 filling groove 114 as the interconnect. The CMP scheme of the present invention is described in further detail herein with reference to FIG. 3 and is particularly advantageous because it is less prone to unintentional removal of the entire interconnect 118.

Figure 3:
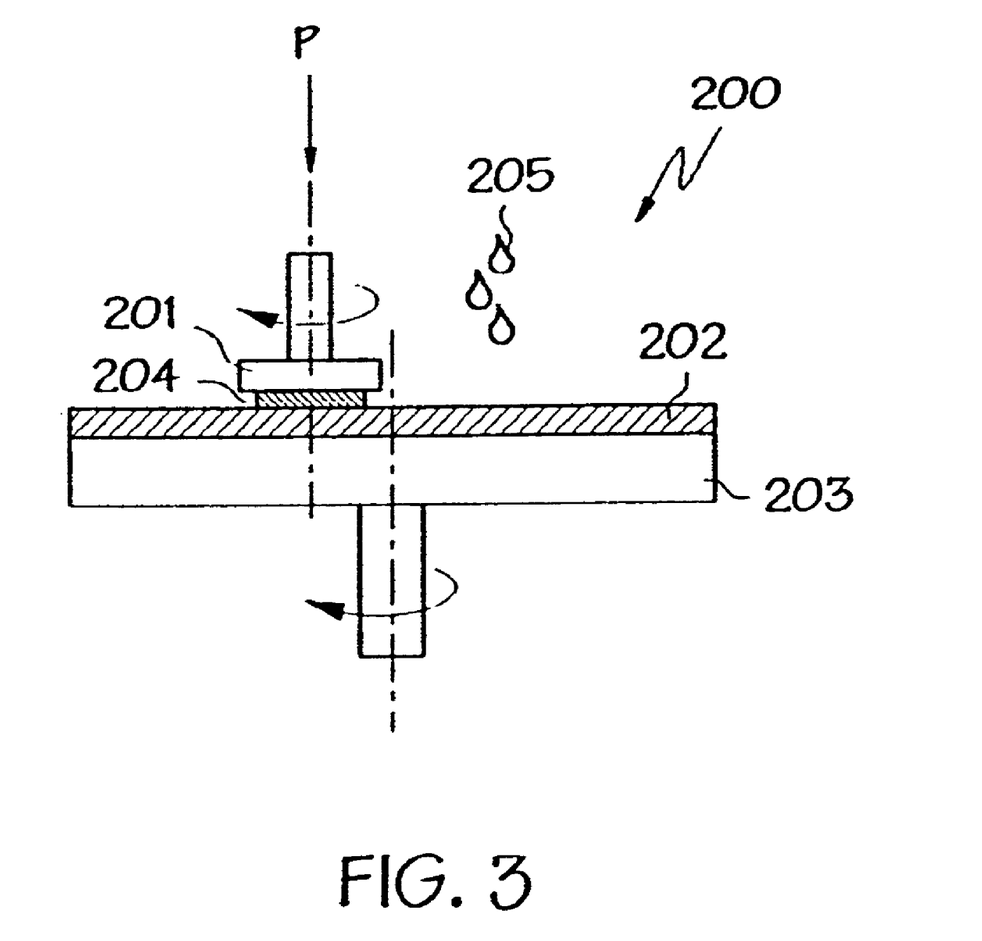
FIG. 3 is a schematic illustration of a CMP assembly according to the present invention.

Turning now to the CMP process of the present invention, reference is made to FIG. 3, where a CMP assembly 200 is illustrated schematically. The CMP assembly 200 includes a rotating platen 201, a rotary wafer holder 203, and a polishing pad 204. An integrated circuit device wafer 202 is mounted on the rotary wafer holder 203 and a slurry composition 205 is provided to enhance the CMP process. The CMP assembly and process is similar to conventional CMP schemes with the exception that the slurry composition and the materials present at the surface of the integrated circuit device are selected to provide an improved CMP scheme that is less prone to unintentional interconnect removal and is minimally selective of silicon nitride and relatively highly selective of silver.

Specifically, the surface of the integrated circuit device to be processed is subject to CMP with a processing slurry selected to be relatively minimally selective of silicon nitride and relatively highly selective of the silver-based conductive material. In this manner, portions of the silver-based conductive material extending beyond the uppermost boundary of the interconnect holes are removed much more rapidly than are portions of the silicon nitride insulating layer. The interconnect holes at issue may either be those holes exposing contact regions for the semiconductor devices formed within the substrate or those holes exposing contact regions for additional interconnects in conductive communication with the semiconductor devices formed within the substrate. For the purposes of defining and describing the present invention, it is noted that a silver-based material includes any material, composition, or mixture of materials including silver. For example, silver-based materials include pure silver, silver coated copper particles, silver-based materials dispersed in an organic medium, a silver containing alloy including, for example, tungsten, copper or gold, etc. Further, it is noted that a silicon nitride material may comprise a pure silicon nitride material or a silicon nitride material including additional components or impurities.

For the purposes of defining and describing the present invention, it is noted that selectivity is defined as the ratio of the removal rate of a target material or materials to be removed to the removal rate of another material subject to contact with a processing slurry. Selectivity is typically calculated by dividing the removal rate of the target materials by the polish removal rate of the material to remain. For example, with reference to the selective CMP process of the present invention, the processing slurry is minimally selective of silicon nitride and relatively highly selective of silver and, as such, removes significantly more silver than the silicon nitride forming the insulating layer. Typical selectivity ratios according to the present invention range from about 50 to about 150.

The processing slurry of the present invention may comprise an abrasive and an oxidizer. In preferred embodiments of the present invention, the processing slurry comprises deionized water, an alumina-based or ceria-based abrasive, and a potassium iodate, hydrogen peroxide, or ammonium persulfate oxidizer. In one embodiment of the present invention, the processing slurry is characterized by a PH of about 3 to about 7 and comprises about 0.1 to about 2 weight percent of alumina-based abrasive and at most about 0.2 weight percent of a hydrogen peroxide oxidizer. The alumina-based abrasive may be characterized by a particle size of between about 50 nm and about 200 nm. Alternatively, the processing slurry may comprise an alumina-based abrasive and a potassium iodate oxidizer characterized by a PH of about 3 to about 4. More specifically, the processing slurry comprises about 1–10 weight percent of the alumina-based abrasive and about 2–7 weight percent of the potassium iodate oxidizer.

Having described the invention in detail and by reference to preferred embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention. For example, although the figures of the present application illustrate the present invention in the context of an interconnect structure, it is contemplated that the present invention also relates more generally to the formation of a variety of semiconductor device structure such as, for example, transistors, capacitors, and interconnects.

What is claimed is:

1. An integrated circuit device processing scheme comprising:
   providing a semiconductor substrate;
   forming a plurality of semiconductor devices in said substrate;
   forming a silicon nitride insulating layer over said plurality of semiconductor devices and said semiconductor substrate, wherein said insulating layer defines an upper surface and a lower surface;
   forming interconnect holes in said insulating layer, wherein said interconnect holes define an uppermost boundary at said upper surface of said insulating layer;
   filling said interconnect holes with a silver-based conductive material, wherein portions of said silver-based conductive material extend beyond said uppermost boundary of said interconnect holes; and
   chemically and mechanically planarizing said integrated circuit device with a processing slurry selected to be relatively minimally selective of silicon nitride and relatively highly selective of said silver-based conductive material including said portions of said silver-based conductive material extending beyond said uppermost boundary of said interconnect holes so as to remove portions of said silver-based conductive material extending beyond said uppermost boundary of said interconnect holes, wherein said integrated circuit device is planarized such that said relatively minimal selectivity of silicon nitride and said relatively high selectivity of said silver-based conductive material define a selectivity ratio above about 50.

2. An integrated circuit device processing scheme as claimed in claim 1 wherein said interconnect holes are formed so as to expose contact regions for additional interconnects in conductive communication with said semiconductor devices formed within said substrate.

3. An integrated circuit device processing scheme as claimed in claim 1 wherein said interconnect holes are formed so as to expose contact regions for said semiconductor devices formed within said substrate.

4. An integrated circuit device processing scheme as claimed in claim 1 wherein said integrated circuit device is planarized such that said relatively minimal selectivity of silicon nitride and said relatively high selectivity of said silver-based material define a selectivity ratio below about 150.

5. An integrated circuit device processing scheme as claimed in claim 1 wherein said integrated circuit device is planarized such that said relatively minimal selectivity of silicon nitride and said relatively high selectivity of said silver-based material define a selectivity ratio from about 50 to about 150.

6. An integrated circuit device processing scheme comprising:
   providing a substrate;
   forming a plurality of devices in said substrate;
   forming an insulating layer over said plurality of devices and said substrate;
   forming interconnect holes in said insulating layer;
   forming a silicon nitride barrier layer over said insulating layer and within said interconnect holes;
   filling said interconnect holes with a silver-based conductive material; and
   chemically and mechanically planarizing said integrated circuit device with a processing slurry selected to be relatively minimally selective of silicon nitride and relatively highly selective of said silver-based conductive material, wherein said integrated circuit device is planarized such that said relatively minimal selectivity of silicon nitride and said relatively high selectivity of said silver-based conductive material define a selectivity ratio above about 50.

7. An integrated circuit device processing scheme comprising:

provi­ding a semiconductor substrate;

forming a plurality of semiconductor devices in said substrate;

forming a silicon nitride insulating layer over said plurality of semiconductor devices and said semiconductor substrate, wherein said insulating layer defines an upper surface and a lower surface;

forming interconnect holes in said insulating layer, wherein said interconnect holes define an uppermost boundary at said upper surface of said insulating layer;

filling said interconnect holes with a silver-based conductive material, wherein portions of said silver-based conductive material extend beyond said uppermost boundary of said interconnect holes; and chemically and mechanically planarizing said integrated circuit device with a processing slurry selected to be minimally selective of silicon nitride and relatively highly selective of said silver-based conductive material including said portions of said silver-based conductive material extending beyond said uppermost boundary of said interconnect holes so as to remove portions of said silver-based conductive material extending beyond said uppermost boundary of said interconnect holes, wherein said processing slurry comprises an abrasive and an oxidizer, wherein said integrated circuit device is planarized such that said relatively minimal selectivity of silicon nitride and said relatively high selectivity of said silver-based conductive material define a selectivity ratio above about 50.

8. An integrated circuit device processing scheme as claimed in claim 7 wherein said processing slurry comprises an alumina-based abrasive and hydrogen peroxide oxidizer.

9. An integrated circuit device processing scheme as claimed in claim 8 wherein said processing slurry comprises about 0.1 to about 2 weight percent of said alumina-based abrasive and at most about 0.2 weight percent of said hydrogen peroxide oxidizer.

10. An integrated circuit device processing scheme as claimed in claim 7 wherein said abrasive is characterized by a particle size of between about 50 nm and about 200 nm.

11. An integrated circuit device processing scheme as claimed in claim 7 wherein said processing Slurry is characterized by a PH of about 3 to about 7.

12. An integrated circuit device processing scheme as claimed in claim 7 wherein said processing slurry is characterized by a PH of about 3 to about 7 and comprises:

an alumina-based abrasive characterized by a particle size of between about 50 nm and about 200 nm; and a hydrogen peroxide oxidizer.

13. An integrated circuit device processing scheme as claimed in claim 7 wherein said processing slurry comprises an alumina-based abrasive and a potassium iodate oxidizer.

14. An integrated circuit device processing scheme as claimed in claim 7 wherein said processing slurry is characterized by a PH of about 3 to about 4 and comprises:

an alumina-based abrasive; and a potassium iodate oxidizer.

15. An integrated circuit device processing scheme as claimed in claim 14 wherein said processing slurry comprises about 1–10 weight percent of said alumina-based abrasive and about 2–7 weight percent of said potassium iodate oxidizer.

16. An integrated circuit device processing scheme as claimed in claim 7 wherein said processing slurry comprises an alumina-based or ceria-based abrasive and a potassium iodate, hydrogen peroxide, or ammonium persulfate oxidizer.

17. An integrated circuit device processing scheme as claimed in claim 7 wherein said processing slurry further comprises deionized water.

18. A method for fabricating an integrated circuit device in a process flow including the steps of providing a semiconductor substrate, forming a plurality of semiconductor devices in said substrate, forming a plurality of interconnects between the semiconductor devices and input and output pads of the integrated circuit device, and packaging said integrated circuit device, said process flow including:

forming a silicon nitride insulating layer over said plurality of semiconductor devices and said semiconductor substrate, wherein said insulating layer defines an upper surface and a lower surface;

forming interconnect holes in said insulating layer, wherein said interconnect holes define an uppermost boundary at said upper surface of said insulating layer;

filling said interconnect holes with a silver-based conductive material, wherein portions of said silver-based conductive material extend beyond said uppermost boundary of said interconnect holes; and chemically and mechanically planarizing said integrated circuit device with a processing slurry selected to be relatively minimally selective of silicon nitride and relatively highly selective of said silver-based conductive material including portions of said silver-based conductive material extending beyond said uppermost boundary of said interconnect holes so as to remove portions of said silver-based conductive material extending beyond said uppermost boundary of said interconnect holes, wherein said integrated circuit device is planarized such that said relatively minimal selectivity of silicon nitride and said relatively high selectivity of said silver-based conductive material define a selectivity ratio above about 50.

19. A processing scheme for a semiconductor wafer defining an upper surface including silver-based conductive material portions and silicon nitride material portions, said process comprising the step of performing chemical mechanical planarization of said upper surface utilizing a slurry having a composition selected to be relatively minimally selective of silicon nitride and relatively highly selective of said silver-based conductive material so as to remove portions of said silver-based conductive material more quickly than portions of said silicon nitride material, wherein said integrated circuit device is planarized such that said relatively minimal selectivity of silicon nitride and said relatively high selectivity of said silver-based conductive material define a selectivity ratio above about 50.

* * * * *

UNITED STATES PATENT AND TRADEMARK OFFICE
CERTIFICATE OF CORRECTION

PATENT NO. : 6,511,906 B1  Page 1 of 1
DATED : January 28, 2003
INVENTOR(S) : Nishant Sinha It is certified that error appears in the above-identified patent and that said Letters Patent is hereby corrected as shown below:

Column 3,
Line 46, Patent reads "µand" should read -- µm and --

Signed and Sealed this

Seventeenth Day of June, 2003

JAMES E. ROGAN
*Director of the United States Patent and Trademark Office*